(12) United States Patent
Miura et al.

(10) Patent No.: US 11,705,434 B2
(45) Date of Patent: Jul. 18, 2023

(54) SEMICONDUCTOR DEVICE

(71) Applicant: Kioxia Corporation, Tokyo (JP)

(72) Inventors: Masayuki Miura, Ota Tokyo (JP); Yuichi Sano, Setagaya Tokyo (JP); Kazuma Hasegawa, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 139 days.

(21) Appl. No.: 17/459,376

(22) Filed: Aug. 27, 2021

(65) Prior Publication Data

US 2022/0285319 A1 Sep. 8, 2022

(30) Foreign Application Priority Data

Mar. 5, 2021 (JP) ................................. 2021-035711

(51) Int. Cl.
*H01L 25/065* (2023.01)
*H01L 23/498* (2006.01)
*H01L 25/00* (2006.01)

(52) U.S. Cl.
CPC .... *H01L 25/0657* (2013.01); *H01L 23/49816* (2013.01); *H01L 25/50* (2013.01); *H01L 2225/06517* (2013.01); *H01L 2225/06548* (2013.01); *H01L 2225/06562* (2013.01)

(58) Field of Classification Search
CPC ........... H01L 25/0657; H01L 23/49816; H01L 25/50; H01L 23/5383
See application file for complete search history.

(56) References Cited

U.S. PATENT DOCUMENTS

| | | | |
|---|---|---|---|
| 10,748,885 B2 | 8/2020 | Akada | |
| 11,594,521 B2* | 2/2023 | Koyanagi | ............. H01L 23/481 |
| 11,600,773 B2* | 3/2023 | Nagase | ............. H10N 70/8828 |
| 2008/0150157 A1 | 6/2008 | Nishimura et al. | |
| 2009/0096111 A1 | 4/2009 | Fujiwara et al. | |
| 2010/0148172 A1 | 6/2010 | Watanabe et al. | |
| 2010/0181661 A1 | 7/2010 | Takemoto et al. | |
| 2012/0286426 A1 | 11/2012 | Kim | |
| 2018/0277529 A1* | 9/2018 | Matsumoto | ......... H01L 25/0657 |
| 2018/0342481 A1 | 11/2018 | Lee et al. | |

(Continued)

FOREIGN PATENT DOCUMENTS

| | | |
|---|---|---|
| JP | 2008-159607 A | 7/2008 |
| JP | 2009-099697 A | 5/2009 |

(Continued)

*Primary Examiner* — Thao P Le
(74) *Attorney, Agent, or Firm* — Foley & Lardner LLP

(57) ABSTRACT

A semiconductor device includes a first stacked body including first semiconductor chips stacked in a first direction and offset relative to each other in a second direction; a first columnar electrode coupled to the first semiconductor chip and extending in the first direction; a second stacked body arranged relative to the first stacked body in the second direction and including second semiconductor chips stacked in the first direction and offset relative to each other in the second direction; a second columnar electrode coupled to the second semiconductor chip and extending in the first direction; and a third semiconductor chip arranged substantially equally spaced to the first columnar electrode and the second columnar electrode.

18 Claims, 14 Drawing Sheets

(56) References Cited

U.S. PATENT DOCUMENTS

| | | | |
|---|---|---|---|
| 2020/0075543 A1 | 3/2020 | Kosaka | |
| 2020/0126919 A1* | 4/2020 | Kang | H01L 23/3121 |
| 2020/0185401 A1* | 6/2020 | Hwang | H10B 43/27 |
| 2020/0303345 A1* | 9/2020 | Goto | H01L 23/49 |

FOREIGN PATENT DOCUMENTS

| | | |
|---|---|---|
| JP | 2010-147070 A | 7/2010 |
| JP | 2011-054725 A | 3/2011 |
| TW | 202011546 A | 3/2020 |

\* cited by examiner

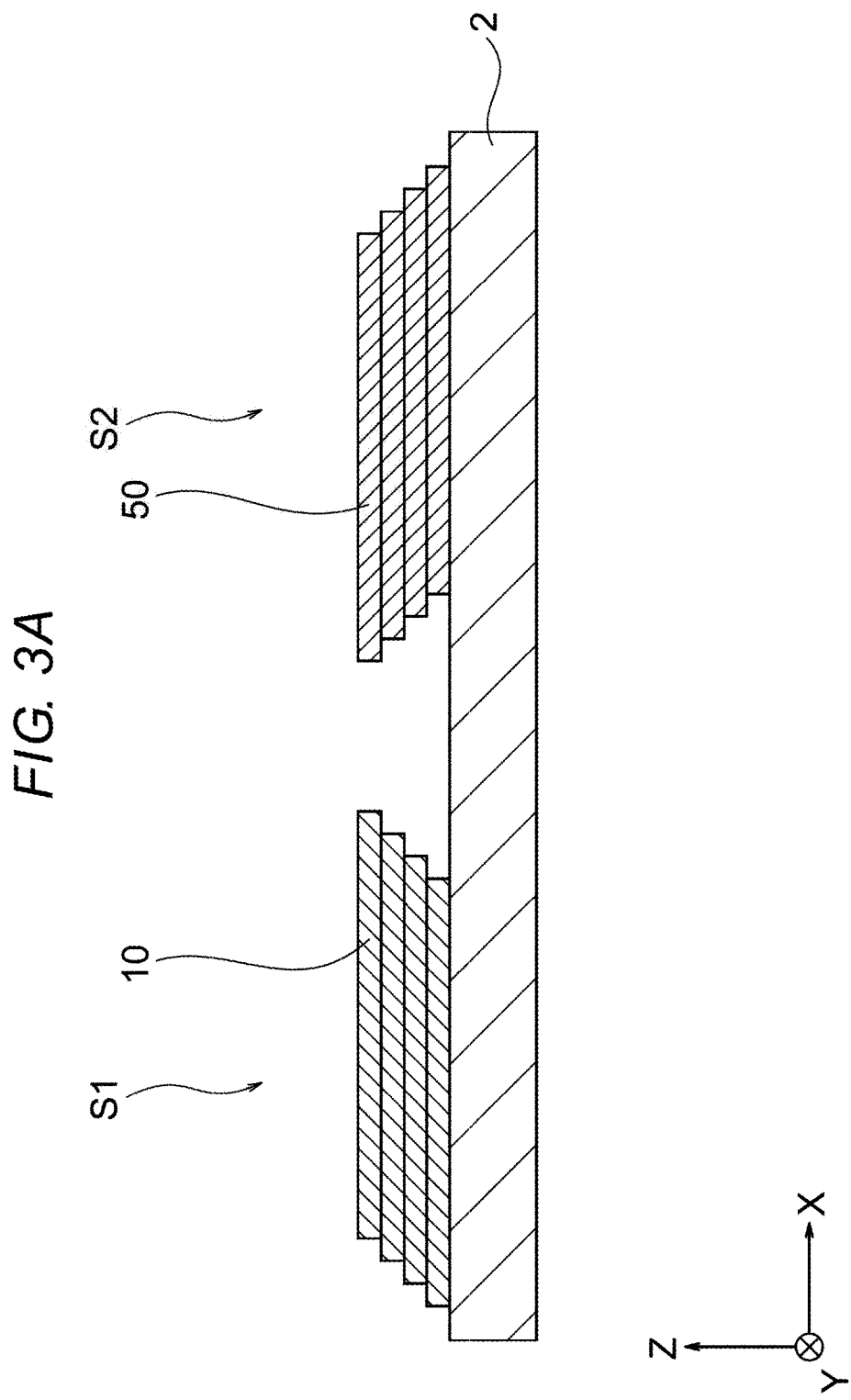

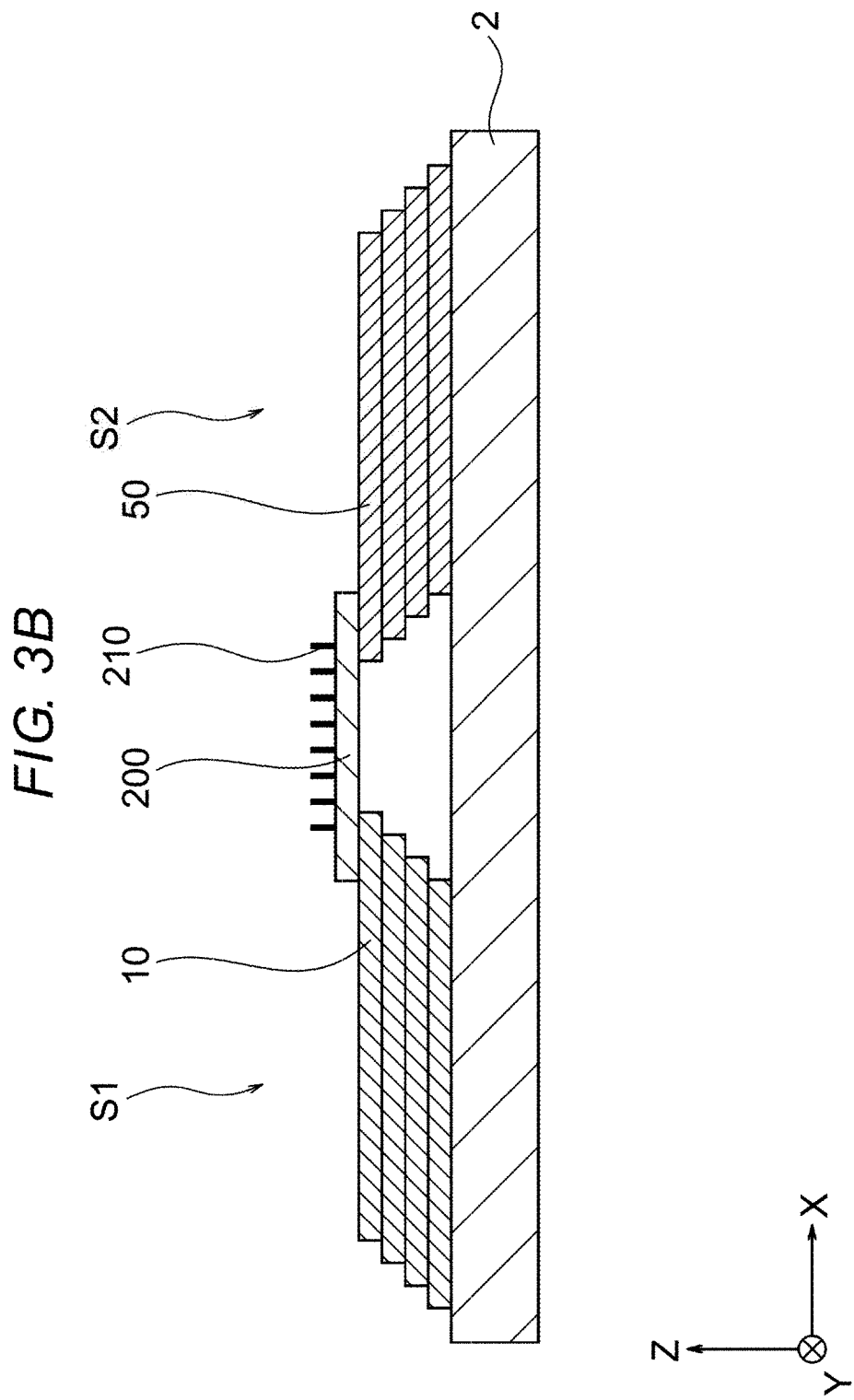

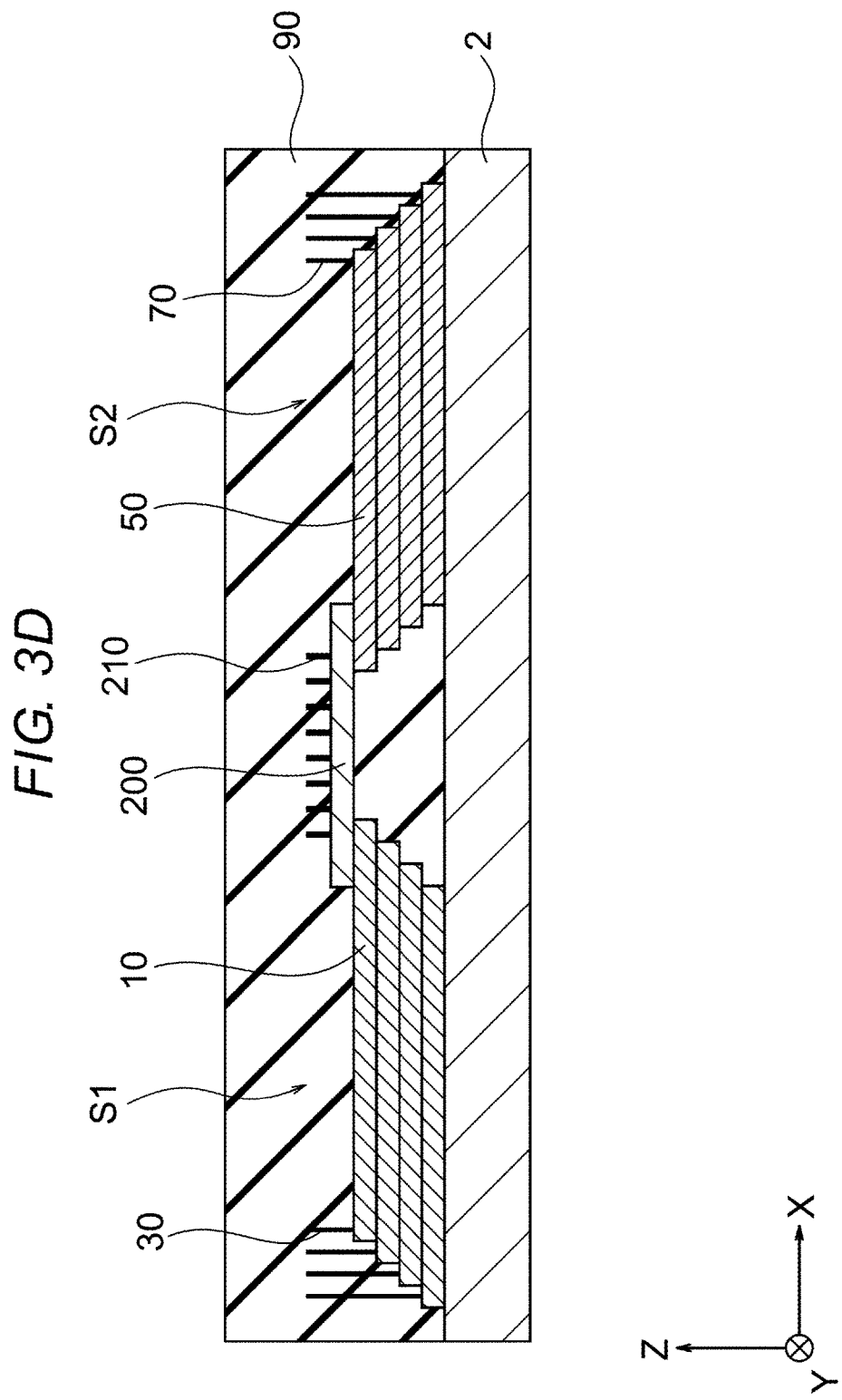

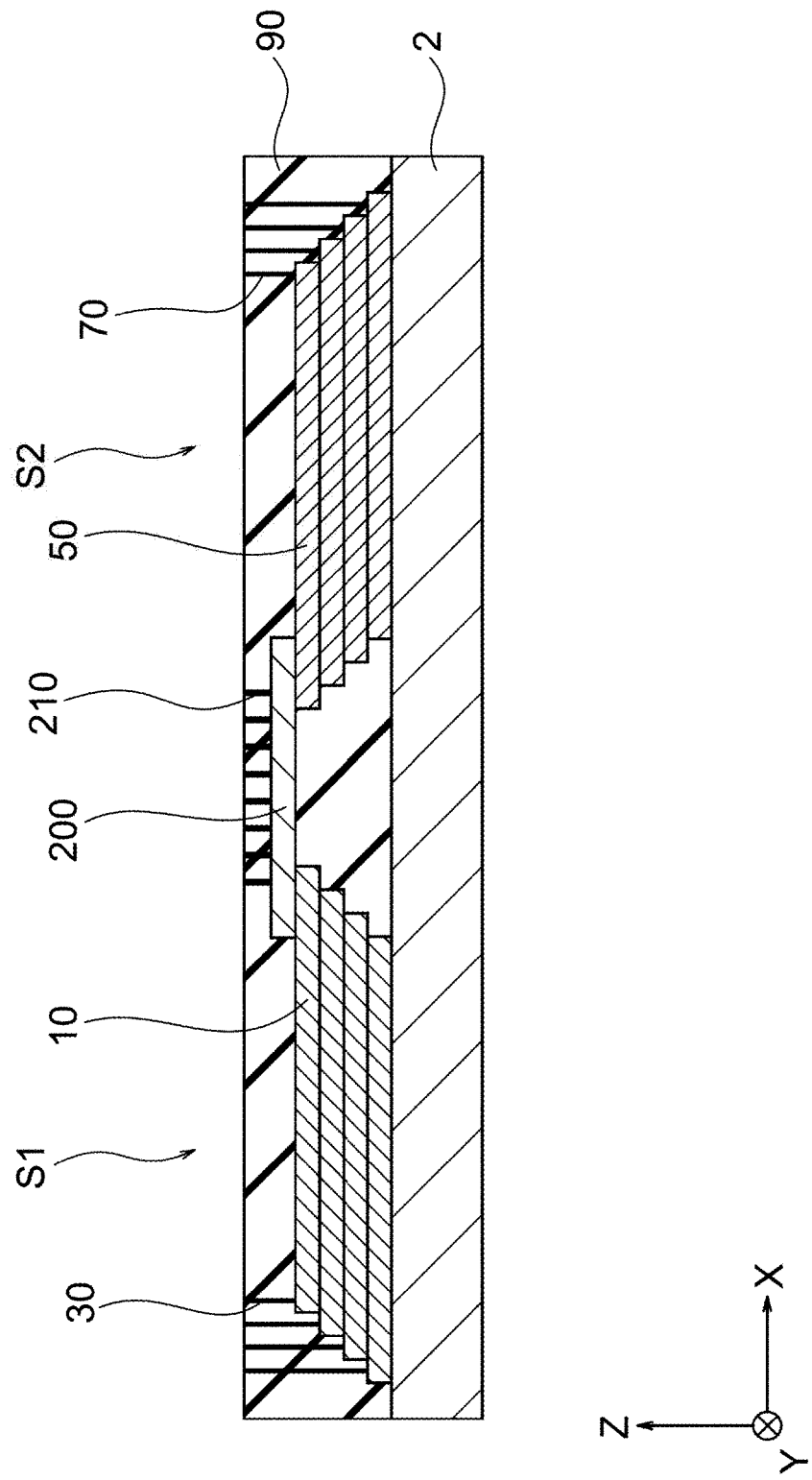

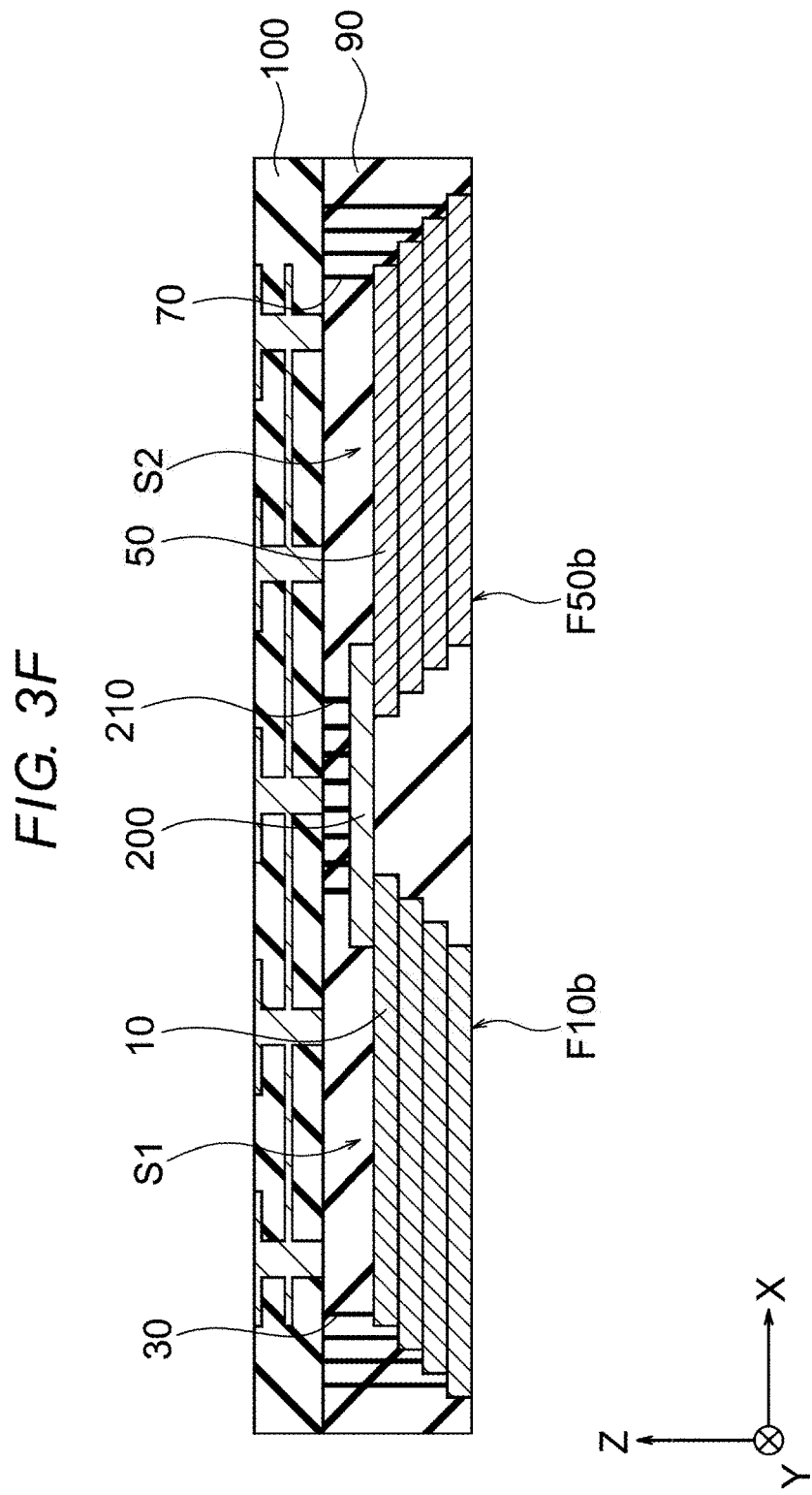

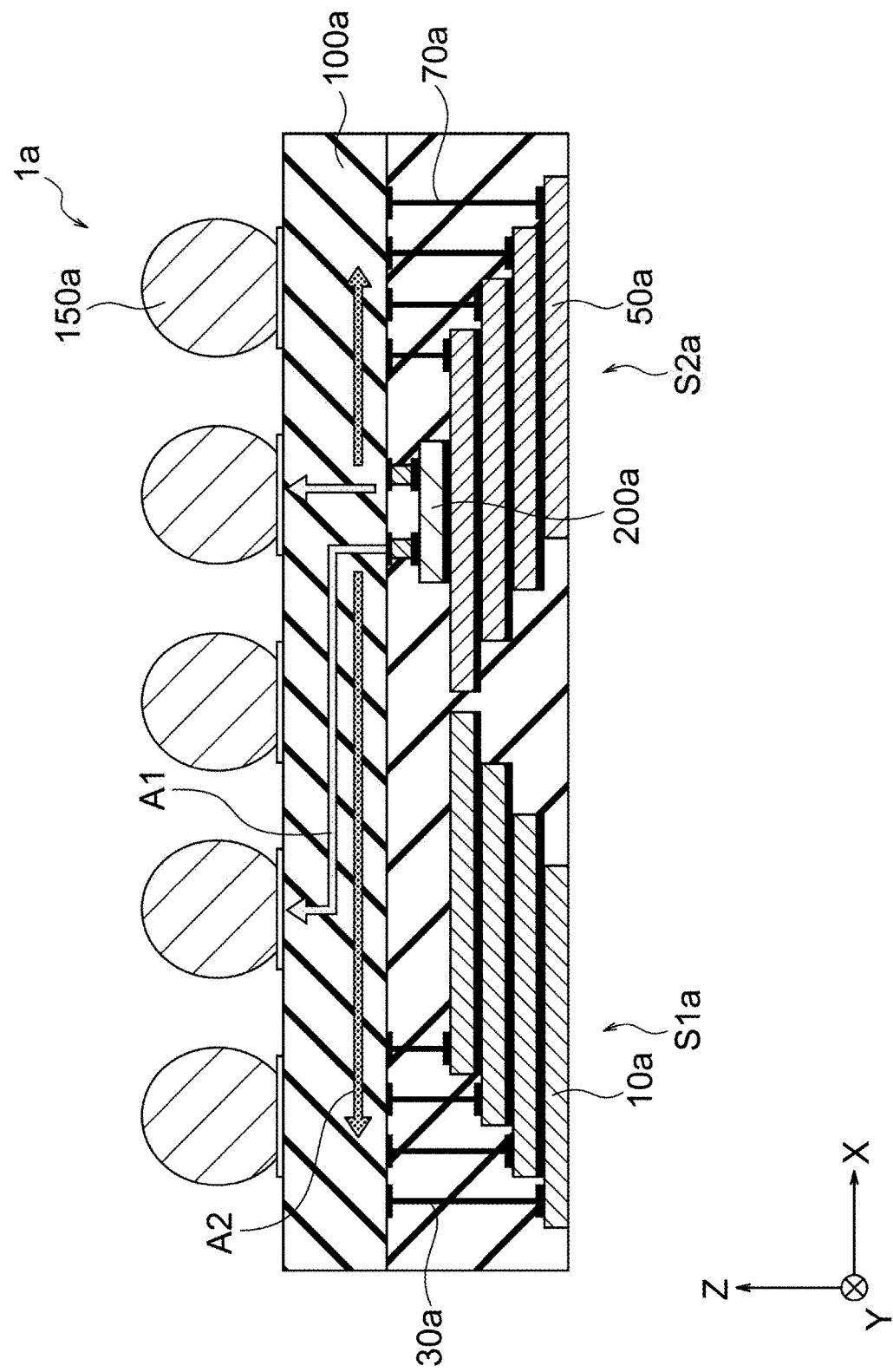

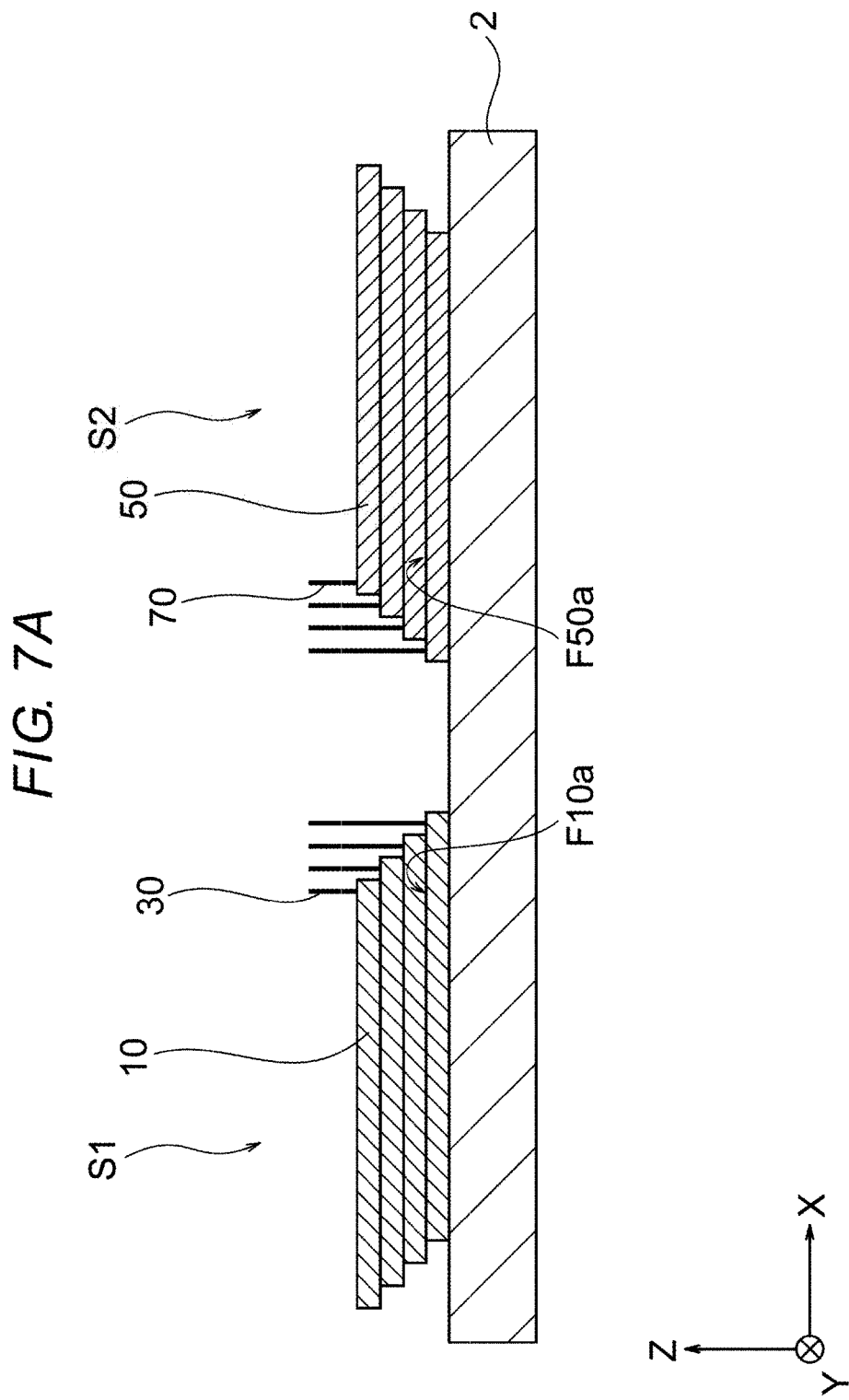

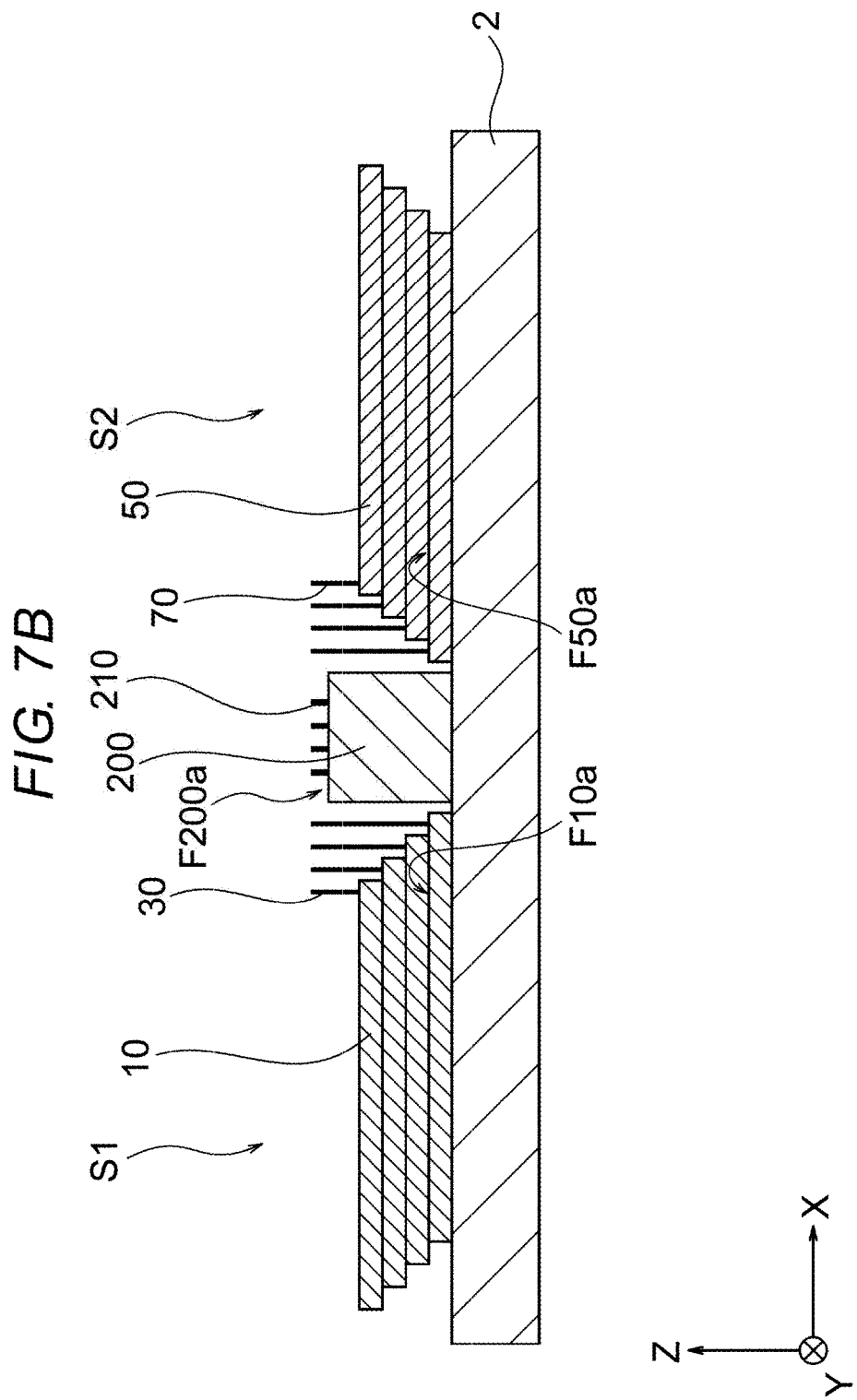

SEMICONDUCTOR DEVICE

CROSS-REFERENCE TO RELATED APPLICATION(S)

This application is based upon and claims the benefit of priority from Japanese Patent Application No. 2021-035711, filed Mar. 5, 2021, the entire contents of which are incorporated herein by reference.

FIELD

Embodiments described herein relate generally to a semiconductor device.

BACKGROUND

In a package structure of a semiconductor device, a semiconductor chip such as a memory chip and a controller chip may be provided on a substrate. It is desired that a wiring length of wiring connected to the semiconductor chip is shorter and a variation is small.

DESCRIPTION OF THE DRAWINGS

FIG. 3A is a cross-sectional view illustrating an example of a method for manufacturing the semiconductor device according to the first embodiment.

FIG. 3B is a cross-sectional view illustrating the example of the method for manufacturing the semiconductor device following FIG. 3A.

FIG. 3D is a cross-sectional view illustrating the example of the method for manufacturing the semiconductor device following FIG. 3C.

FIG. 3E is a cross-sectional view illustrating the example of the method for manufacturing the semiconductor device following FIG. 3D.

FIG. 3F is a cross-sectional view illustrating the example of the method for manufacturing the semiconductor device following FIG. 3E.

FIG. 4 is a cross-sectional view illustrating an example of a configuration of a semiconductor device according to a comparative example.

FIG. 7A is a cross-sectional view illustrating an example of a method for manufacturing the semiconductor device according to the second embodiment.

FIG. 7B is a cross-sectional view illustrating the example of the method for manufacturing the semiconductor device following FIG. 7A.

DETAILED DESCRIPTION

Figure 1:
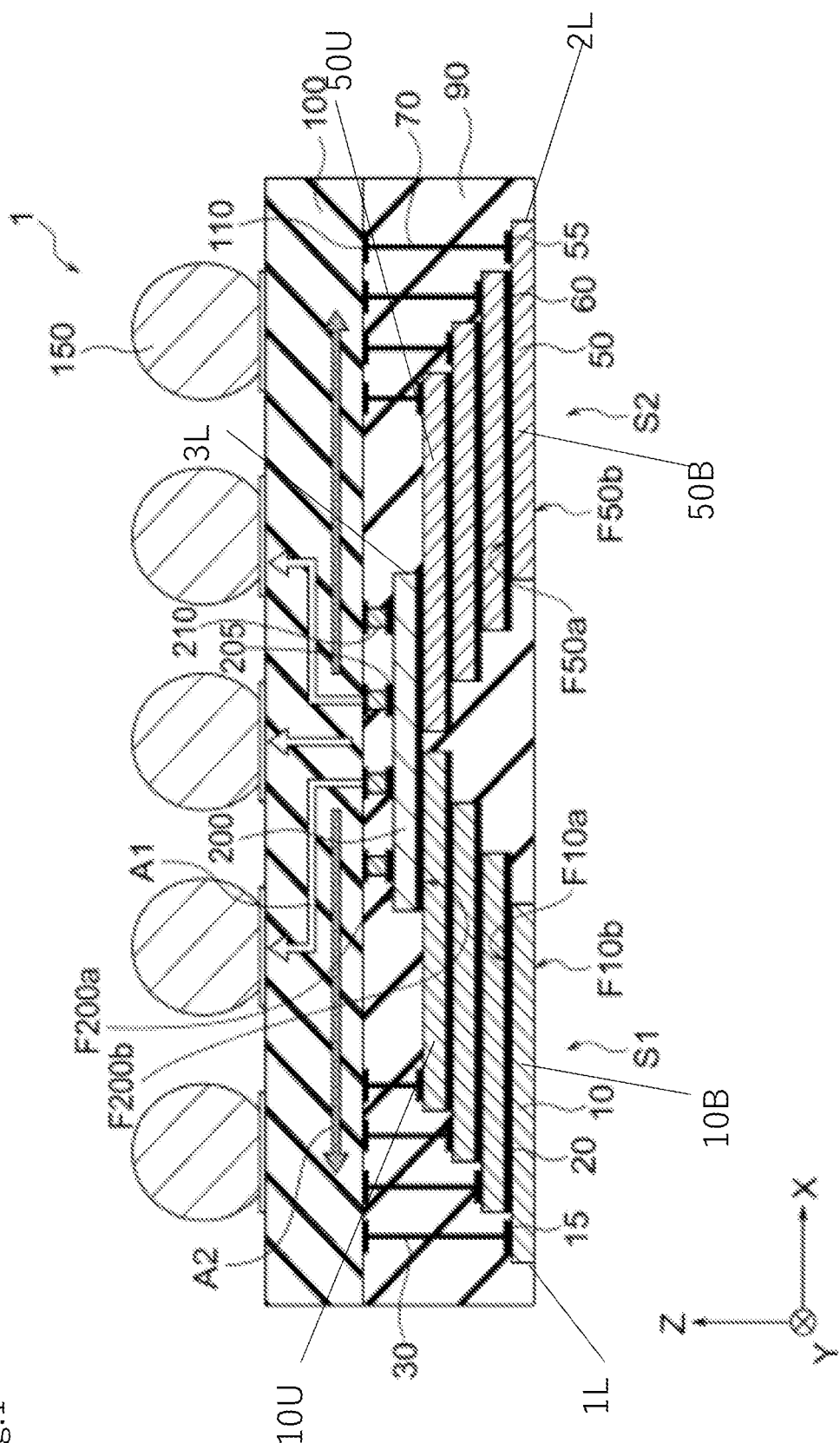
FIG. 1 is a cross-sectional view illustrating an example of a configuration of a semiconductor device according to a first embodiment.

Embodiments provide a semiconductor device capable of setting a wiring length to a more appropriate length.

In general, according to one embodiment, the semiconductor device includes a first stacked body including a plurality of first semiconductor chips stacked on top of one another in a first direction and offset relative to each other in a second direction perpendicular to the first direction; a first columnar electrode coupled to an electrode pad of the first semiconductor chip and extending in the first direction; a second stacked body arranged relative to the first stacked body in the second direction and including a plurality of second semiconductor chips stacked on top of one another in the first direction and offset relative to each other in the second direction; a second columnar electrode coupled to an electrode pad of the second semiconductor chip and extending in the first direction; and a third semiconductor chip arranged substantially equally spaced to the first columnar electrode and the second columnar electrode.

Hereinafter, embodiments according to the present disclosure will be described with reference to the drawings. The present disclosure is not limited to the embodiments. In the following embodiments, a vertical direction indicates a relative direction when a stacking direction of a semiconductor chip is upward or downward, and may be different from a vertical direction according to a gravity acceleration. The drawings are schematic or conceptual drawings. Ratios or the like of respective parts are not necessarily the same as actual ones. In the specification and the drawings, the same elements as those described in preceding drawings are denoted by the same reference numerals, and a detailed description is omitted as appropriate.

First Embodiment

FIG. 1 is a cross-sectional view illustrating an example of a configuration of a semiconductor device 1 according to a first embodiment. The semiconductor device 1 includes a stacked body S1, columnar electrodes 30, a stacked body S2, columnar electrodes 70, a semiconductor chip 200, connecting pillars 210, a resin layer 90, a redistribution layer 100, and metal bumps 150. The semiconductor device 1 may be, for example, a semiconductor package such as a NAND flash memory or a large scale integration (LSI).

The stacked body S1 includes semiconductor chips 10 and adhesive layers 20. The adhesive layer 20 is, for example, a die attachment film (DAF). The stacked body S1 is a stacked body in which a plurality of semiconductor chips 10 are stacked in a way of being deviated in a direction perpendicular to the stacking direction.

Each of the plurality of semiconductor chips 10 has a first surface F10a and a second surface F10b opposite to the first surface. A semiconductor element (not illustrated) such as a memory cell array, a transistor, or a capacitor is formed on the first surface F10a of each semiconductor chip 10. The semiconductor element on the first surface F10a of the semiconductor chip 10 is covered and protected by an insulating film (not illustrated). For the insulating film, for example, an inorganic insulating material such as a silicon oxide film or a silicon nitride film is used. In addition, a material in which an organic insulating material is formed on the inorganic insulating material may be used for the insulating film. As the organic insulating material, for example, an organic insulating material such as a resin such as a phenol-based resin, a polyimide-based resin, a polyamide-based resin, an acrylic resin, an epoxy-based resin, a p-phenylenebenzobisoxazole (PBO)-based resin, a silicone-based resin, and a benzocyclobutene-based resin, or a mixed material or a composite material thereof is used. The semiconductor chip 10 may be, for example, a memory chip of the NAND flash memory or a semiconductor chip on which an optional LSI is mounted. The semiconductor chip 10 may be a semiconductor chip having a configuration the same as each other, or may be a semiconductor chip having a different configuration from each other.

The plurality of semiconductor chips 10 are stacked and bonded by the adhesive layers 20. For the adhesive layer 20, for example, the organic insulating material such as the resin such as the phenol-based resin, the polyimide-based resin, the polyamide-based resin, the acrylic resin, the epoxy-based resin, the p-phenylenebenzobisoxazole (PBO)-based resin, the silicone-based resin, and the benzocyclobutene-based resin, or the mixed material or the composite material thereof is used. Each of the plurality of semiconductor chips 10 includes an electrode pad 15 exposed on the first surface F10a. The other semiconductor chip 10 (upper semiconductor chip 10) stacked on the semiconductor chip 10 (lower semiconductor chip 10) is stacked in a way of being deviated in a substantially vertical direction (X direction) with respect to a side on which the electrode pad 15 of the lower semiconductor chip 10 is provided so as not to overlap the electrode pad 15 of the lower semiconductor chip 10.

The electrode pad 15 is electrically connected to one of semiconductor elements provided in the semiconductor chip 10. For the electrode pad 15, for example, a simple substance of Cu, Ni, W, Au, Ag, Pd, Sn, Bi, Zn, Cr, Al, Ti, Ta, TiN, TaN, CrN, or the like, a composite film of two or more of these substances, or a low-resistance metal such as two or more types of these substances is used.

The columnar electrode 30 is connected to the electrode pad 15 of the semiconductor chip 10 and extends in the stacking direction (Z direction) of the plurality of semiconductor chips 10. The adhesive layer 20 is partially removed so as to expose a part of the electrode pad 15, and the columnar electrode 30 can be connected to the electrode pad 15. Alternatively, the adhesive layer 20 is attached to the second surface F10b of the upper semiconductor chip 10, and is provided so as not to overlap the electrode pad 15 of the lower semiconductor chip 10. A lower end of the columnar electrode 30 is connected to the electrode pad 15 by, for example, a wire bonding method. An upper end of the columnar electrode 30 reaches an upper surface of the resin layer 90, and is exposed on the upper surface of the resin layer 90. The upper end of the columnar electrode 30 is connected to an electrode pad 110 of the redistribution layer 100.

The semiconductor chips 10 of the stacked body S1 are stacked in a way of being deviated toward the stacked body S2 so as to expose the electrode pads 15. The columnar electrode 30 is connected to the electrode pad 15 disposed on an opposite side of the stacked body S2 on the first surface F10a.

The stacked body S2 includes semiconductor chips 50 and adhesive layers 60. The stacked body S2 is a stacked body in which the plurality of semiconductor chips 50 are stacked in a way of being deviated in the direction perpendicular to the stacking direction.

Each of the plurality of semiconductor chips 50 has a first surface F50a and a second surface F50b opposite to the first surface F50a. The semiconductor element (not illustrated) such as the memory cell array, the transistor, or a capacitor is formed on the first surface F50a of each semiconductor chip 50. The semiconductor element on the first surface F50a of the semiconductor chip 50 is covered and protected by the insulating film (not illustrated). For the insulating film, for example, the inorganic insulating material such as the silicon oxide film or the silicon nitride film is used. In addition, the material in which the organic insulating material is formed on the inorganic insulating material may be used for the insulating film. As the organic insulating material, for example, the organic insulating material such as the resin such as the phenol-based resin, the polyimide-based resin, the polyamide-based resin, the acrylic resin, the epoxy-based resin, the p-phenylenebenzobisoxazole (PBO)-based resin, the silicone-based resin, and the benzocyclobutene-based resin, or the mixed material or the composite material thereof is used. The semiconductor chip 50 may be, for example, the memory chip of the NAND flash memory or the semiconductor chip on which the optional LSI is mounted. The semiconductor chips 50 may have the same configuration, or may have different configuration from each other. Further, the semiconductor chip 50 may be a semiconductor chip having the same configuration as the semiconductor chip 10, or may be a semiconductor chip having a configuration different from that of the semiconductor chip 10.

The plurality of semiconductor chips 50 are stacked and bonded by the adhesive layers 60. Each of the plurality of semiconductor chips 50 includes an electrode pad 55 exposed on the first surface F50a. The semiconductor chips 50 stacked on the other semiconductor chip 50 are stacked in a way of being deviated in the substantially vertical direction (X direction) with respect to the side on which the electrode pads 55 are provided so as not to overlap the electrode pads 55 of the other semiconductor chips 50.

The electrode pad 55 is electrically connected to one of the semiconductor elements provided in the semiconductor chip 50. For the electrode pad 55, for example, the simple substance of Cu, Ni, W, Au, Ag, Pd, Sn, Bi, Zn, Cr, Al, Ti, Ta, TiN, TaN, CrN, or the like, the composite film of two or more of these substances, or the low-resistance metal such as two or more types of these substances is used.

The columnar electrode 70 is connected to the electrode pad 55 of the semiconductor chip 50 and extends in the stacking direction (Z direction) of the plurality of semiconductor chips 50. The adhesive layer 60 is partially removed so as to expose a part of the electrode pad 55, and the columnar electrode 70 can be connected to the electrode pad 55. Alternatively, the adhesive layer 60 is attached to the second surface F50b of the upper semiconductor chip 50, and is provided so as not to overlap the electrode pad 55 of the lower semiconductor chip 50. A lower end of the columnar electrode 70 is connected to the electrode pad 55 by, for example, the wire bonding method. An upper end of the columnar electrode 70 reaches the upper surface of the resin layer 90, and is exposed on the upper surface of the resin layer 90. The upper end of the columnar electrode 70 is connected to the electrode pad 110 of the redistribution layer 100.

The semiconductor chips 50 of the stacked body S2 are stacked in a way of being deviated toward the stacked body S1 so as to expose the electrode pads 55. The columnar electrode 70 is connected to the electrode pad 55 disposed on the opposite side of the stacked body S1 on the first surface F50a.

The semiconductor chip 200 has a first surface F200a and a second surface F200b opposite to the first surface. The semiconductor element (not illustrated) such as the transistor or the capacitor is formed on the first surface F200a of each semiconductor chip 200. The semiconductor element on the first surface F200a of the semiconductor chip 200 is covered and protected by the insulating film (not illustrated). The insulating film may, for example, include the inorganic insulating material such as the silicon oxide film or the silicon nitride film. In addition, the material in which the organic insulating material is formed on the inorganic insulating material may be used for the insulating film. As the organic insulating material, for example, the organic insulating material such as the resin such as the phenol-based resin, the polyimide-based resin, the polyamide-based resin, the acrylic resin, the epoxy-based resin, the p-phenylenebenzobisoxazole (PBO)-based resin, the silicone-based resin, and the benzocyclobutene-based resin, or the mixed material or the composite material thereof is used. The semiconductor chip 200 may be, for example, a controller chip that controls the memory chips (semiconductor chips 10 and 50) or the semiconductor chip on which the optional LSI is mounted.

The semiconductor chip 200 is stacked on the semiconductor chips 10 and 50, and is bonded to the semiconductor chips 10 and 50 by the adhesive layer. Each of the semiconductor chips 200 includes electrode pads 205 exposed on the first surface F200a. When viewed from a direction perpendicular to the stacking direction, the semiconductor chip 200 is provided between a first side 1L and a second side 2L. The first side 1L is an outer side of a side in a direction opposite to the stacked body S2 of a lowermost layer chip 10B of the stacked body S1. The second side 2L is an outer side of a side in a direction opposite to the stacked body S1 of a lowermost layer chip 10B of the stacked body S2. Details of an arrangement of the semiconductor chip 200 will be described later.

The connecting pillar (connection bump) 210 is connected to the electrode pad 205 of the semiconductor chip 200 and extends in the Z direction. A lower end of the connecting pillar 210 is connected to the electrode pads 205 of the semiconductor chip 200. An upper end of the connecting pillar 210 reaches the upper surface of the resin layer 90, and is exposed on the upper surface of the resin layer 90. The upper end of the connecting pillar 210 is connected to the electrode pad 110 of the redistribution layer 100. As a material of the connecting pillar 210, for example, a conductive metal such as Cu may be used. The columnar electrode 30 and the columnar electrode 70 may be formed by wire bonding or the like, and the connecting pillar 210 may be formed by a plating method or the like. Therefore, a diameter and a material of the columnar electrode 30, the columnar electrode 70 and the connecting pillar 210 may be different.

The resin layer 90 covers (seals) the stacked bodies S1 and S2, the semiconductor chip 200, the columnar electrodes 30 and 70, and the connecting pillars 210, and exposes tips of the columnar electrodes 30 and 70 and the connecting pillars 210 on the upper surface thereof.

As the resin layer 90, for example, the organic insulating material such as the resin such as the phenol-based resin, the polyimide-based resin, the polyamide-based resin, the acrylic resin, the epoxy-based resin, the p-phenylenebenzobisoxazole (PBO)-based resin, the silicone-based resin, and the benzocyclobutene-based resin, or the mixed material or the composite material thereof is used.

The redistribution layer (RDL) 100 is provided on the resin layer 90 and is electrically connected to the columnar electrodes 30 and 70 and the connecting pillars 210. The redistribution layer 100 is a multilayer wiring layer in which a plurality of wiring layers and a plurality of insulating layers are stacked, and the columnar electrodes 30, 70 and the connecting pillars 210 are respectively connected to the metal bumps 150 as electrodes. FIG. 1 schematically illustrates the wiring layers in the redistribution layer 100.

The metal bumps 150 are provided on the redistribution layer 100 and are electrically connected to the wiring layers of the redistribution layer 100. The metal bumps 150 are used for connection to an external device (not illustrated). For the metal bump 150, for example, a simple substance of Sn, Ag, Cu, Au, Pd, Bi, Zn, Ni, Sb, In, and Ge, a composite film of two or more of these substances, or an alloy is used.

Next, the arrangement of the stacked bodies S1 and S2 will be described in detail.

The stacked body S2 is arranged side by side with the stacked body S1 in the direction perpendicular to the stacking direction. For example, the stacked bodies S1 and S2 are disposed such that the second surfaces F10b and F50b of the lowermost semiconductor chip 10 and the lowermost semiconductor chip 50 are flush with each other. A height of the stacked body S1 and a height of the stacked body S2 are substantially the same.

Next, the arrangement of the semiconductor chip 200 will be described in detail.

In an example illustrated in FIG. 1, the semiconductor chip 200 is disposed such that a distance to the columnar electrode 30 and a distance to the columnar electrode 70 are substantially equal to each other. The semiconductor chip 200 extends over the two stacked bodies S1 and S2. The semiconductor chip 200 is provided so as to straddle the first uppermost layer chip 10U, which is the uppermost layer chip of the stacked body S1, and the second uppermost layer chip 50U, which is the uppermost layer chip of the stacked body S2.

An arrow A1 in FIG. 1 indicates a connection wiring from the semiconductor chip 200 to the external device (metal bump 150) in the rewiring layer 100. Since the semiconductor chip 200 extends over the stacked bodies S1 and S2, it is possible to prevent the variation in a wiring length between the semiconductor chip 200 and the external device and to further shorten the wiring length.

An arrow A2 in FIG. 1 indicates the connection wiring from the semiconductor chip 200 to the semiconductor chips 10 and 50 in the redistribution layer 100. Since the semiconductor chip 200 extends over the stacked bodies S1 and S2, a wiring length from the semiconductor chip 200 to the semiconductor chip 10 and a wiring length from the semiconductor chip 200 to the semiconductor chip 50 can be made substantially equal. That is, the variation in the wiring length can be prevented, and an equal-length wiring can be more easily provided.

Figure 2:
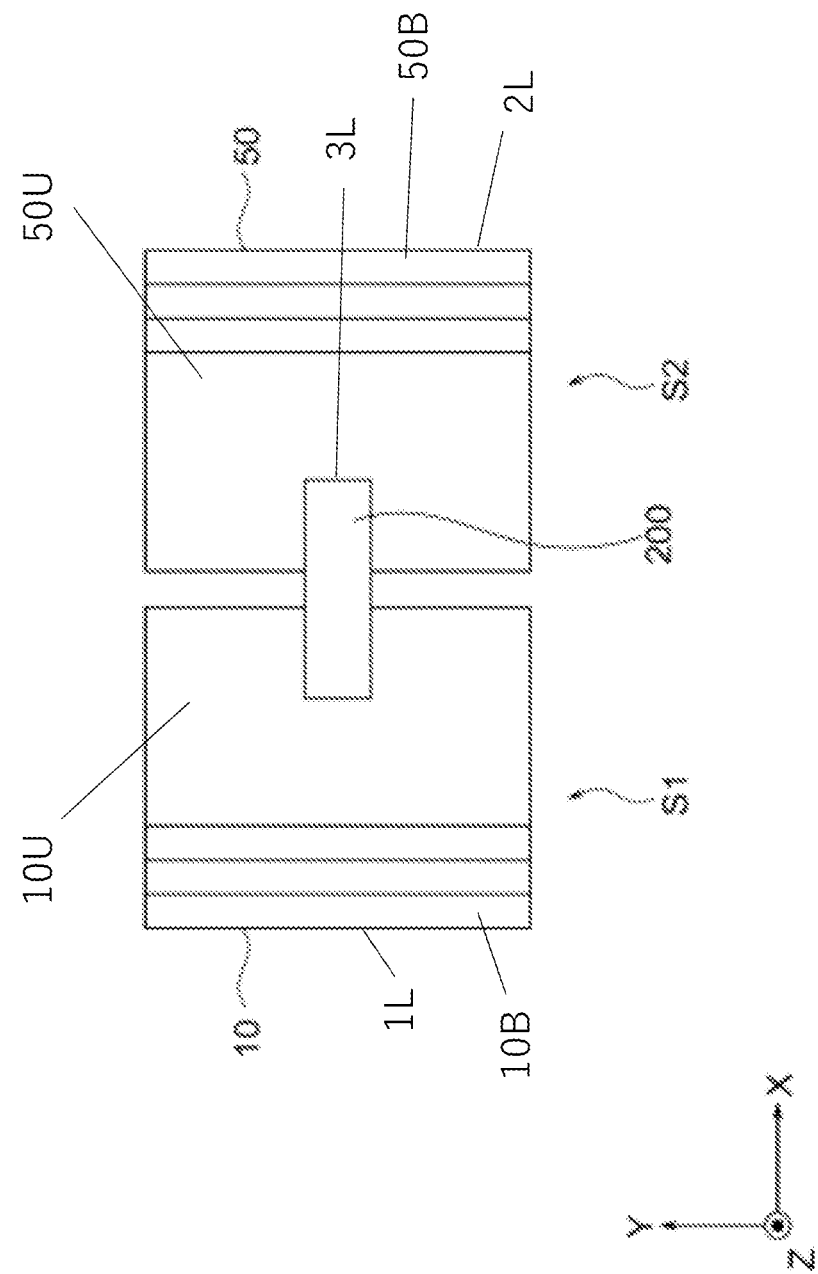
FIG. 2 is a plan view illustrating the example of the configuration of the semiconductor device according to the first embodiment.

FIG. 2 is a plan view illustrating an example of the configuration of the semiconductor device 1 according to the first embodiment. FIG. 2 is a view of the stacked bodies S1 and S2 and the semiconductor chip 200 in FIG. 1 as viewed from the Z direction.

The semiconductor chip 200 is disposed at a substantially central portion of regions of the stacked bodies S1 and S2 when viewed from the stacking direction. Further, the semiconductor chip 200 is disposed at a substantially central portion of a package when viewed from the stacking direction.

In the example illustrated in FIG. 2, the semiconductor chips 10, 50, and 200 have a substantially rectangular shape when viewed from the stacking direction. In this case, the semiconductor chips 10 and 50 are arranged such that respective long sides of the semiconductor chips 10 and 50 face each other such that a package area becomes small. The semiconductor chip 200 is disposed such that a long side of the semiconductor chip 200 is orthogonal to the long sides of the semiconductor chips 10 and 50. The third side 3L of the semiconductor chip 200 is in parallel with the first side 1L and the second side 2L.

Next, a method for manufacturing the semiconductor device 1 will be described.

FIGS. 3A to 3F are cross-sectional views illustrating an example of a method for manufacturing the semiconductor device 1 according to the first embodiment. In FIGS. 3A to 3F, the adhesive layers 20, 60 and the electrode pads 15, 55, 205 or the like are omitted.

First, as illustrated in FIG. 3A, the stacked body S1 is formed by stacking the plurality of semiconductor chips 10 on a support substrate 2. At this time, the semiconductor chip 10 is bonded onto the other semiconductor chip 10 by the adhesive layer 20. The support substrate 2 may be a metal plate such as silicon, glass, ceramic, a resin plate, or a lead frame.

Next, the stacked body S2 is formed by stacking the plurality of semiconductor chips 50 on the support substrate 2. At this time, the semiconductor chip 50 is bonded onto the other semiconductor chip 50 by the adhesive layer 60.

Either of the stacked bodies S1 and S2 may be formed first.

Next, as illustrated in FIG. 3B, the semiconductor chip 200 is stacked on the uppermost semiconductor chips 10 and 50. That is, the semiconductor chip 200 is mounted on the two stacked bodies S1 and S2 after stacking the semiconductor chips 10 and 50. The semiconductor chip 200 is mounted so as to extend over the two stacked bodies S1 and S2. For example, the connecting pillar 210 is formed on the electrode pad 205 of the semiconductor chip 200 before the semiconductor chip 200 is provided on the uppermost semiconductor chip 50. The connecting pillar 210 is formed by, for example, a plating method. As the material of the connecting pillar 210, for example, the conductive metal such as Cu is used.

Figure 3C:
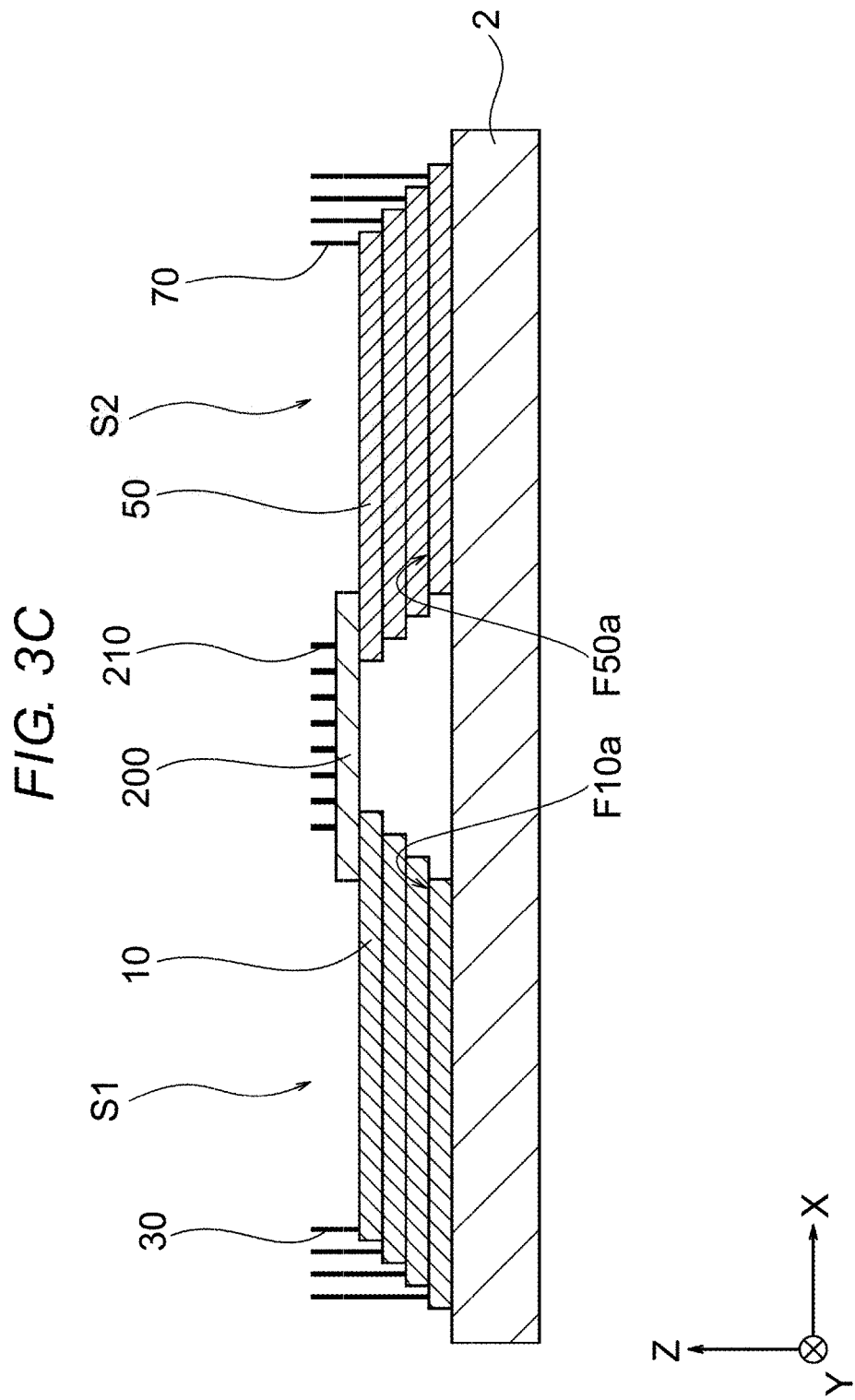
FIG. 3C is a cross-sectional view illustrating the example of the method for manufacturing the semiconductor device following FIG. 3B.

Next, as illustrated in FIG. 3C, the columnar electrodes 30 and 70 are formed on the semiconductor chips 10 and 50, respectively. Metal wires (conductive wires) are bonded onto the electrode pads 15 and 55 of the semiconductor chips 10 and 50 by the wire bonding method, and the metal wires are pulled out in the substantially vertical direction to the first surfaces F10a and F50a to form the columnar electrodes 30 and 70. Further, the columnar electrodes 30 and 70 are cut at the upper ends, and the columnar electrodes 30 and 70 maintain an upright state as they are due to rigidity of the columnar electrodes 30 and 70 themselves.

For the columnar electrodes 30 and 70, for example, a simple substance of Cu, Ni, W, Au, Ag, Pd, Sn, Bi, Zn, Cr, Al, Ti, and Ta, a composite material of two or more of these substances, or an alloy of two or more of these substances is used. Preferably, as the material of the columnar electrodes 30 and 70, a simple substance of Au, Ag, Cu, and Pd, a composite material of two or more of these substances, or an alloy of two or more of these substances is used. More preferably, as the material of the columnar electrodes 30 and 70, a material having a high hardness, for example, Cu, a CuPd alloy, or a material in which Pd is coated on Cu is used. As a result, the columnar electrodes 30 and 70 are less likely to bend and collapse when covered with the resin layer 90.

Next, as illustrated in FIG. 3D, a structure including the stacked bodies S1 and S2, the semiconductor chip 200, the columnar electrodes 30 and 70, and the connecting pillars 210 is covered with the resin layer 90. For the resin layer 90, for example, the resins such as epoxy-based, phenol-based, polyimide-based, polyamide-based, acrylic-based, PBO-based, silicone-based, and benzocyclobutene-based resins, the mixed materials thereof, and the composite materials are used. Examples of the epoxy resin include, but are not particularly limited to, bisphenol-type epoxy resins such as bisphenol A type, bisphenol F type, bisphenol AD type, and bisphenol S type; novolac type epoxy resins such as phenol novolac type and cresol novolac type; aromatic epoxy resins such as resorcinol type epoxy resin and trisphenolmethane triglycidyl ether; naphthalene type epoxy resins; fluorene type epoxy resins; dicyclopentadiene type epoxy resins; polyether-modified epoxy resins; benzophenone type epoxy resins; aniline type epoxy resins; NBR modified epoxy resins; CTBN modified epoxy resins; and hydrogenated products thereof. Among these resins, the naphthalene-type epoxy resins and the dicyclopentadiene-type epoxy resins are preferable since these resins have good adhesion to silicon. In addition, since quick curability is easily obtained, the benzophenone-type epoxy resin is also preferable. These epoxy resins may be used alone or in combination of two or more. The resin layer 90 may include a filler such as silica.

After the resin layer 90 is formed, the resin layer 90 is heated in an oven or the like, or the resin layer 90 is irradiated with ultraviolet (UV) light to cure the resin layer 90.

Next, as illustrated in FIG. 3E, the upper surface of the resin layer 90 is ground such that the columnar electrodes 30 and 70 and the connecting pillars 210 are exposed from the resin layer 90. For example, the resin layer 90 is polished until the columnar electrodes 30 and 70 and the connecting pillars 210 are exposed by using a chemical mechanical polishing (CMP) method, a mechanical polishing method, or the like.

Next, as illustrated in FIG. 3F, the redistribution layer 100 is formed on the resin layer 90. For the insulating layer of the redistribution layer 100, for example, the resins such as epoxy-based, phenol-based, polyimide-based, polyamide-based, acrylic-based, PBO-based, silicone-based, and benzocyclobutene-based resins, the mixed materials and the composite materials thereof are used. For the wiring layer of the redistribution layer 100, for example, the simple substance of Cu, Ni, W, Au, Ag, Pd, Sn, Bi, Zn, Cr, Al, Ti, Ta, TiN, TaN and CrN, the composite material of two or more of these substances, or the alloy of two or more of these substances is used. FIG. 3F schematically illustrates the wiring layer in the redistribution layer 100.

Next, the support substrate 2 is peeled off by using light such as heat or laser. Alternatively, the support substrate 2 may be polished and removed. The adhesive layers 20 and 60 provided on the second surfaces F10b and F50b of the lowermost semiconductor chips 10 and 50 are also removed.

After a step of FIG. 3F, the metal bumps 150 are formed on the redistribution layer 100. The metal bumps 150 may be formed using, for example, a ball mounting method, the plating method, or a printing method. For the metal bump 150, for example, a simple substance of Sn, Ag, Cu, Au, Pd, Bi, Zn, Ni, Sb, In, and Ge, a composite film of two or more of these substances, or an alloy is used.

Thereafter, the structure obtained in the step of FIG. 3F and the resin layer 90 are separated into individual packages by dicing. Accordingly, the semiconductor device 1 illustrated in FIG. 1 is obtained.

In steps of FIGS. 3A to 3C, a formation of the stacked body S1, a formation of the columnar electrode 30, a formation of the stacked body S2, and a formation of the columnar electrode 70 may be performed in this order.

When there is a margin in the thickness of the package, the support substrate 2 may be left as it is without removing the support substrate 2 in the step of FIG. 3F. In this case, the package of the semiconductor device 1 is diced together with the support substrate 2. The support substrate 2 can protect the second surface F10b of the lowermost semiconductor chip 10 and the second surface F50b of the lowermost semiconductor chip 50. When the support substrate 2 is made of metal or the like, the electromagnetic wave shielding property is improved. Further, the support substrate 2 may be set to the ground potential. In such an embodiment, an adhesive layer is interposed between the support substrate 2 and a lower most chip of the stacked body S1, a lowermost chip of the stacked body S2.

In the above embodiment, the columnar electrodes 30 and 70 are formed by the wire bonding method as an example, and may be formed by the plating method. For example, holes reaching the electrode pads 15 and 55 are formed in the resin layer 90, and then the metal material is embedded in the holes by the plating method. Accordingly, the columnar electrodes 30 and 70 can be formed by the plating method. The columnar electrodes 30 and 70 may be formed by using both the plating method and the wire bonding method.

The columnar electrodes 30 and 70 according to the present embodiment may be mixed with a wire that directly connects the electrode pads of the semiconductor chips formed by the normal wire bonding method. Further, the wire that directly connects the semiconductor chips, the columnar electrodes formed by the wire bonding method, and the columnar electrodes formed by the plating method may be mixed.

As described above, according to the first embodiment, the semiconductor chip 200 is disposed such that the distance to the columnar electrode 30 and the distance to the columnar electrode 70 are substantially equal to each other. The semiconductor chip 200 extends over the two stacked bodies S1 and S2. Accordingly, the wiring length in the substrate which is the redistribution layer 100 can be shortened. In addition, the variation in the wiring length can be prevented, and the equal-length wiring can be more easily provided. Therefore, the wiring length can be set to a more appropriate length.

FIG. 4 is a cross-sectional view illustrating an example of a configuration of a semiconductor device 1a according to a comparative example.

In the example illustrated in FIG. 4, a semiconductor chip 200a is disposed on a stacked body S2a. Therefore, the semiconductor chip 200a is disposed at a position where a distance to a columnar electrode 30a and a distance to a columnar electrode 70a are different from each other. In this case, as indicated by the arrow A1 in FIG. 4, there is a possibility that the wiring length from the semiconductor chip 200a to the external device is long due to a large variation in the wiring length. The long wiring length between the semiconductor chip 200a and the external device hinders speeding up of the semiconductor device 1a. Further, as indicated by the arrow A2 in FIG. 4, the wiring length from the semiconductor chip 200a to the semiconductor chip 10a is longer than the wiring length from the semiconductor chip 200a to the semiconductor chip 50a due to the large variation in the wiring length. Therefore, it is difficult to provide the equal-length wiring.

On the other hand, in the first embodiment, the semiconductor chip 200 is disposed such that the distances to the columnar electrodes 30 and 70 are substantially equal to each other. Further, the semiconductor chip 200 is disposed at the substantially central portion of the package when viewed from the stacking direction. Accordingly, as indicated by the arrow A1 in FIG. 1, it is possible to prevent the wiring length between the semiconductor chip 200 and the external device from being long. In addition, as indicated by the arrow A2 in FIG. 1, the equal-length wiring between the semiconductor chip 200 and the semiconductor chips 10 and 50 can be more easily provided.

In the first embodiment, the redistribution layer 100 is used as the substrate. By using the redistribution layer 100, a thinner wiring can be obtained as compared with a flip-chip connection to a wiring substrate. However, the redistribution layer 100 may not be provided, and the resin layer 90 illustrated in FIG. 3E may be flip-chip connected to the wiring substrate. For example, when an interval between adjacent columnar electrodes is wide, the redistribution layer 100 is not necessary. Accordingly, a step of mounting the redistribution layer 100 is not required. In addition, since the redistribution layer 100 is not required, a cost of the semiconductor device 1 is reduced.

In the first embodiment, the number of the stacked semiconductor chips 10 in the stacked body S1 and the number of the stacked semiconductor chips 50 in the stacked body S2 are substantially the same, which is four stages. The number of four stages is more preferable from a viewpoint of the equal-length wiring.

The connecting pillar 210 is connected to the electrode pad 205 of the semiconductor chip 200. Instead of the connecting pillar 210, the columnar electrode may be connected to the electrode pad 205. However, the smaller a pad pitch of the electrode pad 205, the more difficult it is to form the columnar electrode. Therefore, the columnar electrode may be used, and it is more preferable that the connecting pillar 210 is used.

The stacking number of the stacked bodies S1 and S2 described above is merely an example.

(Modification of First Embodiment)

Figure 5:
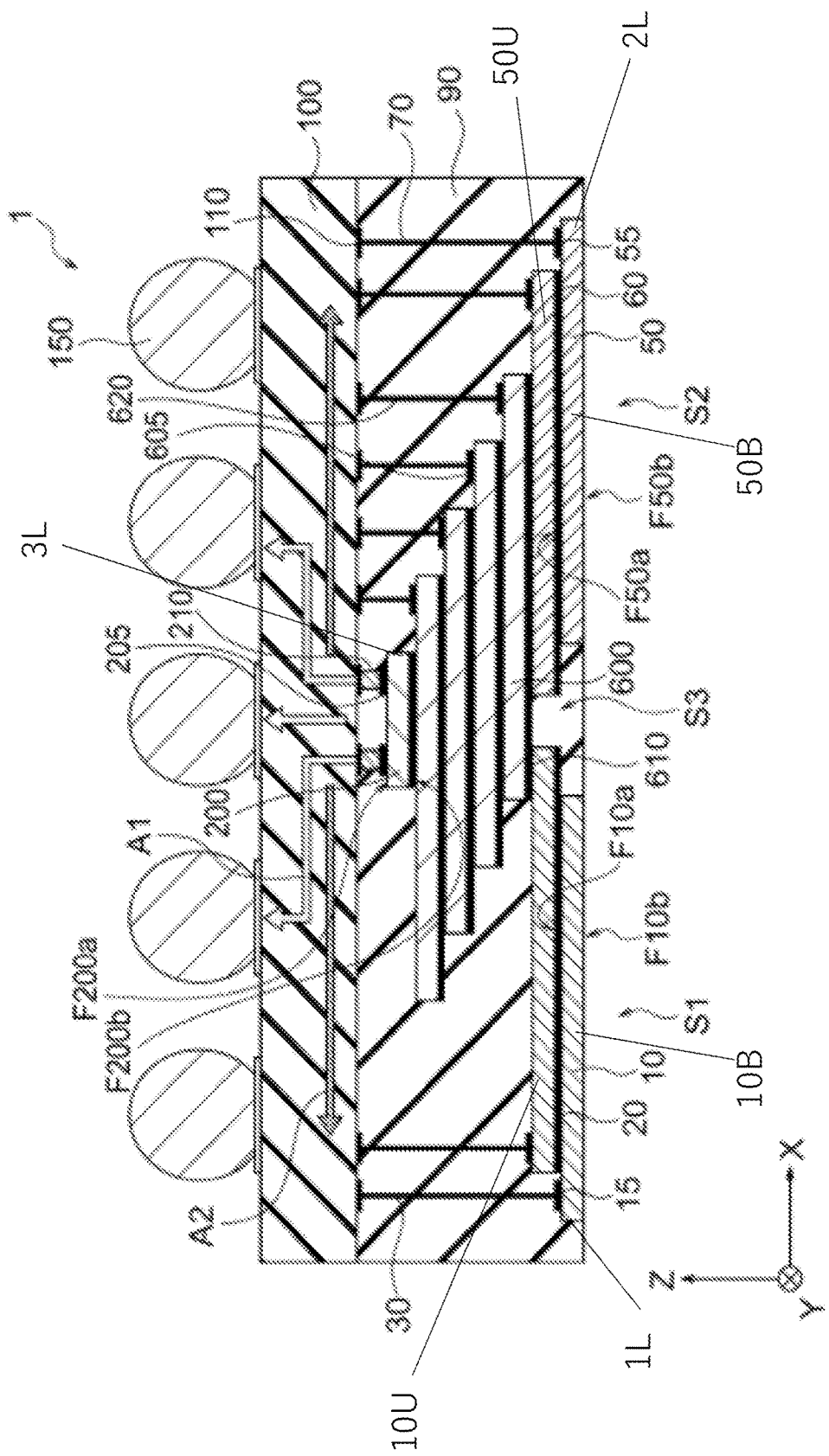
FIG. 5 is a cross-sectional view illustrating an example of a configuration of a semiconductor device according to a modification of the first embodiment.

FIG. 5 is a cross-sectional view illustrating an example of a configuration of the semiconductor device 1 according to a modification of the first embodiment.

The semiconductor device 1 further includes a stacked body S3 and columnar electrodes 620.

The stacked body S1 includes the semiconductor chips 10 that are stacked in two stages. The stacked body S2 includes the semiconductor chips 50 that are stacked in two stages.

The stacked body S3 extends over the two stacked bodies S1 and S2 having substantially the same height. The stacked body S3 includes semiconductor chips 600 that are stacked in four stages. The semiconductor chips 600 of the stacked body S3 are stacked in a way of being deviated in the direction perpendicular to the stacking direction. The plurality of semiconductor chips 600 are bonded by adhesive layers 610. In the example illustrated in FIG. 5, the semiconductor chips 600 of the stacked body S3 are stacked in a way of being deviated in a −X direction similarly to the stacked body S2. The stacked body S3 can also be considered as the stacked body that is extended and stacked from the stacked body S2. That is, it can also be considered that an amount of deviation of one semiconductor chip in the middle of the stacked body S2 is large so as to extend over the stacked body S1.

The columnar electrodes 620 are connected to the electrode pads 605 of the semiconductor chips 600 and extend in the stacking direction (Z direction) of the plurality of semiconductor chips 600.

The semiconductor chips 600 of the stacked body S3 are stacked in a way of being deviated in the same direction as the stacked body S2 so as to expose the electrode pads 605. The columnar electrode 620 is connected to the electrode pad 605 disposed on the opposite side of the stacked body S1 on a first surface F600a.

The semiconductor chip 200 is disposed on the stacked body S3. Accordingly, the semiconductor chip 200 can be disposed such that the wiring length from the semiconductor chip 200 to the semiconductor chip 10 and the wiring length from the semiconductor chip 200 to the semiconductor chip 50 can be made substantially equal. As a result, the wiring length can be further shortened, and the equal-length wiring can be more easily provided.

The columnar electrodes 620 are disposed between the columnar electrodes 30 and the columnar electrodes 70. Therefore, the wiring length from the semiconductor chip 200 to the semiconductor chips 600 can be made shorter than the wiring length from the semiconductor chip 200 to the semiconductor chips 10 and 50.

The stacked body S3 may be the semiconductor chip 600 of one stage.

Second Embodiment

Figure 6:
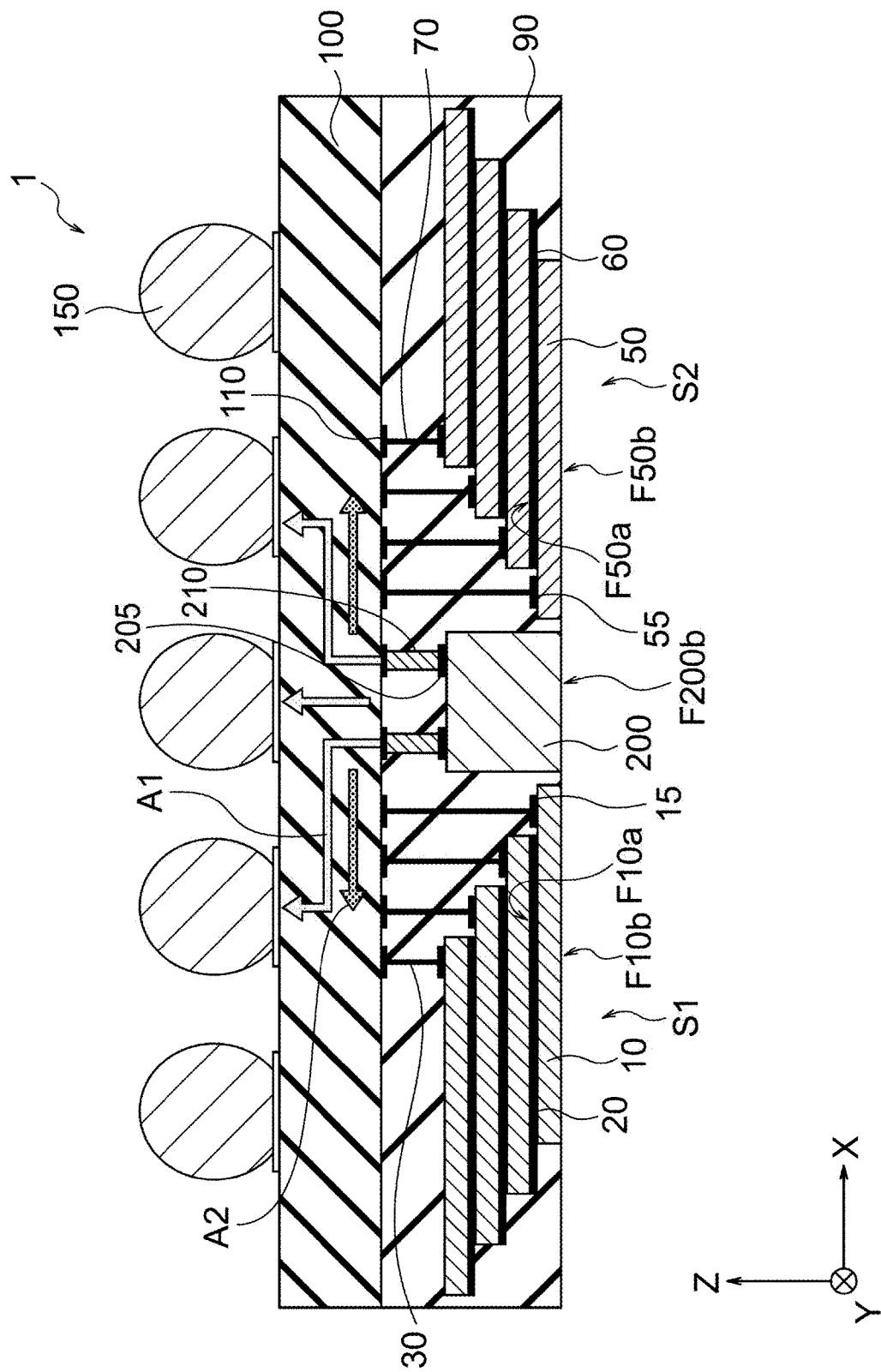
FIG. 6 is a cross-sectional view illustrating an example of a configuration of a semiconductor device according to a second embodiment.

FIG. 6 is a cross-sectional view illustrating an example of a configuration of the semiconductor device 1 according to a second embodiment. The second embodiment is different from the first embodiment in an arrangement of the semiconductor chip 200. Further, the direction of the deviation of the semiconductor chips 10 and 50 of the stacked bodies S1 and S2 is also different from that of the first embodiment.

The semiconductor chips 10 of the stacked body S1 are stacked in a way of being deviated in the direction (−X direction) opposite to the direction of the stacked body S2 and the semiconductor chip 200 so as to expose the electrode pads 15. The columnar electrode 30 is connected to the electrode pad 15 disposed on a stacked body S1 and semiconductor chip 200 side on the first surface F10a.

The semiconductor chips 50 of the stacked body S2 are stacked in a way of being deviated in the direction (X direction) opposite to that of the stacked body S1 and the semiconductor chip 200 so as to expose the electrode pads 55. The columnar electrode 70 is connected to the electrode pad 55 disposed on a stacked body S2 and semiconductor chip 200 side on the first surface F50a.

The semiconductor chip 200 is arranged side by side between the stacked body S1 and the stacked body S2. More specifically, the semiconductor chip 200 is sandwiched between the stacked body S1 and the stacked body S2 in an adjacent manner.

The semiconductor chip 200 is disposed such that, for example, the second surfaces F10b, F50b, and F200b of the lowermost semiconductor chip 10, the lowermost semiconductor chip 50, and the semiconductor chip 200 are flush with each other. The semiconductor chip 200 is likely to be high in temperature during operation. Since the second surface F200b of the semiconductor chip 200 is exposed from the resin layer 90, a heat dissipation of the semiconductor chip 200 can be improved.

The semiconductor chip 200 is thicker than the semiconductor chips 10 and 50. Accordingly, the connecting pillars 210 to be formed can be further shortened. A thickness of the semiconductor chip 200 is substantially the same as the height of one of the semiconductor chips 10 and 50. In the semiconductor chip 200, the semiconductor substrate on the second surface F200b, which is the opposite side of the semiconductor element, is polished and thinned to a desired thickness. In the example illustrated in FIG. 6, the thickness of the semiconductor chip 200 is, for example, substantially the same as the height of the stacked bodies S1 and S2. The thickness of the semiconductor chip 200 is, for example, about 300 µm to about 500 µm. Further, a height of the semiconductor chip 200 may be higher than the height of the stacked body S1 and S2. In such an embodiment, the length of the connection pillar 210 can be shortened. When the connection pillar 210 is formed by a plating method or the like, a fabrication time can be shortened and the required resources can be reduced.

Next, a method for manufacturing the semiconductor device 1 will be described.

FIGS. 7A and 7B are cross-sectional views illustrating an example of a method for manufacturing the semiconductor device according to the second embodiment.

First, as illustrated in FIG. 7A, after the stacked bodies S1 and S2 are formed, the columnar electrodes 30 and 70 are formed.

Next, as illustrated in FIG. 7B, the semiconductor chip 200 is provided between the stacked body S1 and the stacked body S2. Subsequent steps are similar to those after FIG. 3D of the first embodiment.

As illustrated in FIGS. 7A and 7B, it is more preferable that the columnar electrodes 30 and 70 are formed and the semiconductor chip 200 is provided in this order. When the columnar electrodes 30 and 70 are formed after the semiconductor chip 200 is provided, a capillary may interfere with the semiconductor chip 200, so that it is necessary to widen a space between the semiconductor chip 200 and the stacked bodies S1 and S2. An increase in the package area can be obtained.

In the second embodiment, the semiconductor chip 200 is arranged side by side between the stacked body S1 and the stacked body S2. Accordingly, similarly to the first embodiment, it is possible to prevent the wiring length from the semiconductor chip 200 to the external device from being long. The semiconductor chip 200 can be disposed such that the wiring length from the semiconductor chip 200 to the semiconductor chip 10 and the wiring length from the semiconductor chip 200 to the semiconductor chip 50 are made substantially equal. Accordingly, similarly to the first embodiment, the wiring length can be further shortened, and the equal-length wiring can be more easily provided. Therefore, the wiring length can be set to the more appropriate length.

Further, the electrode pads 15 and 55 are disposed on the semiconductor chip 200 side of the first surfaces F10a and F50a, respectively. As a result, the distance between the connecting pillars 210 and the columnar electrodes 30 and 70 can be further shortened. As a result, the wiring length between the semiconductor chip 200 and the semiconductor chips 10 and 50 can be made more appropriate.

The semiconductor chip 200 of the second embodiment is not disposed on the stacked bodies S1 and S2 of the first embodiment. Accordingly, it is possible to form the connecting pillar 210 having a length in consideration of a thickness tolerance of the semiconductor chip 200 itself without considering a height tolerance of the stacked bodies S1 and S2. As a result, the connecting pillars 210 to be formed can be further shortened.

Since the other configuration of the semiconductor device 1 according to the second embodiment is similar to the corresponding configuration of the semiconductor device 1 according to the first embodiment, a detailed description thereof will be omitted. The semiconductor device 1 according to the second embodiment can achieve similar effects as those of the first embodiment.

(Modification of Second Embodiment)

Figure 8:
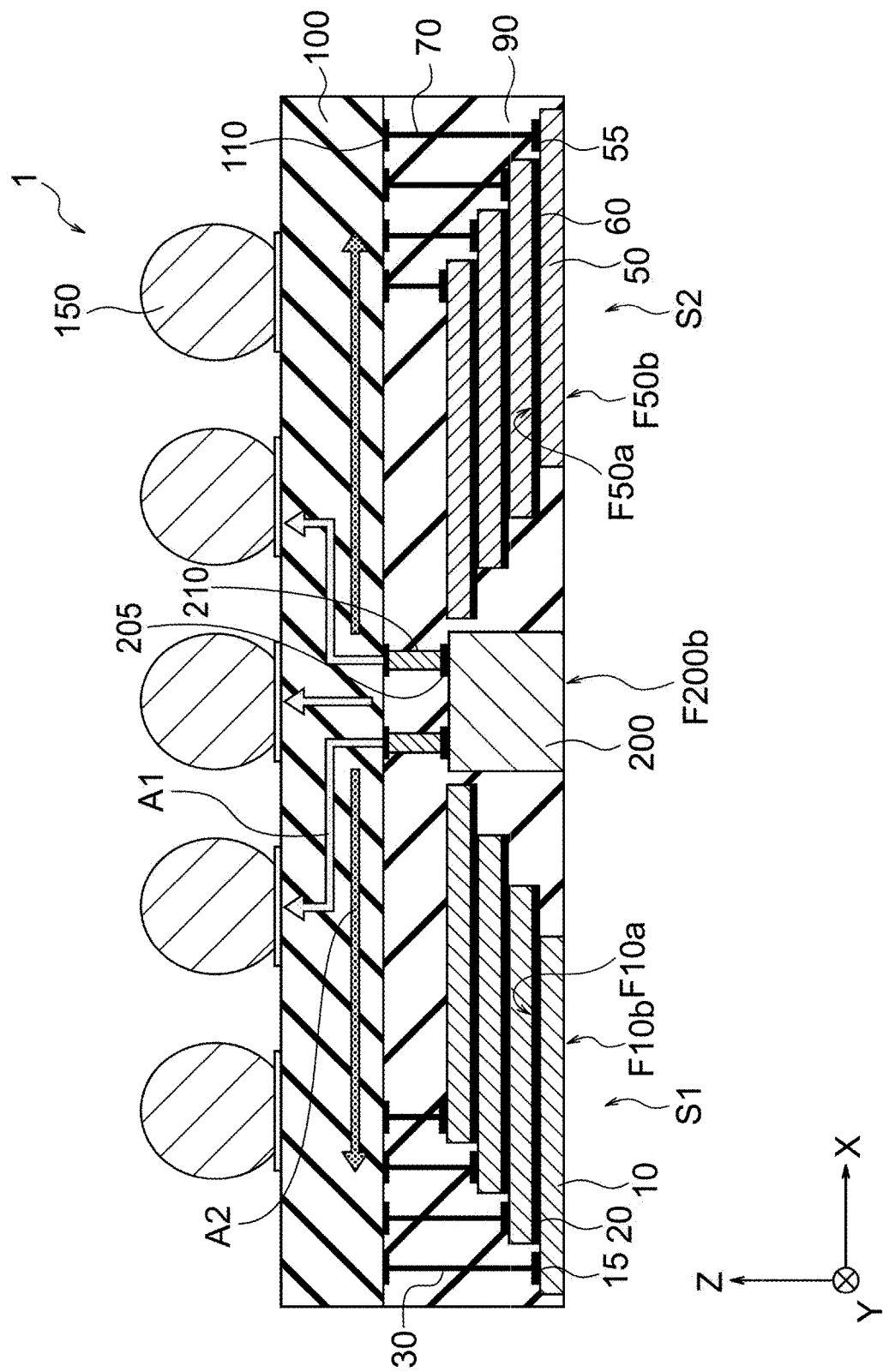
FIG. 8 is a cross-sectional view illustrating an example of a configuration of a semiconductor device according to a modification of the second embodiment.

FIG. 8 is a cross-sectional view illustrating an example of a configuration of the semiconductor device 1 according to a modification of the second embodiment. The modification of the second embodiment is different from the second embodiment in the direction of the deviation of the semiconductor chips 10 and 50 of the stacked bodies S1 and S2.

The semiconductor chips 10 of the stacked body S1 are stacked in a way of being deviated toward the stacked body S2 and the semiconductor chip 200. Therefore, the electrode pad 15 is disposed on the opposite side of the stacked body S2 and the semiconductor chip 200 on the first surface F10a.

The semiconductor chips 50 of the stacked body S2 are stacked in a way of being deviated toward the stacked body S1 and the semiconductor chip 200. Therefore, the electrode pad 55 is disposed on the opposite side of the stacked body S1 and the semiconductor chip 200 on the first surface F50a.

The arrow A2 in FIG. 8 is longer than the arrow A2 in FIG. 6 in the second embodiment. Therefore, the electrode pads and 55 may be disposed on the opposite side of the semiconductor chip 200, and from the viewpoint of the wiring length, the electrode pads 15 and 55 are more preferably disposed on the semiconductor chip 200 side as in the second embodiment.

Other Embodiments (a) In the first embodiment, a lower surfaces of the stacked body S1 and the stacked body S2 are exposed from the resin layer 90. At this time, heat dissipation is improved. A lower surfaces of the stacked body S1 and the stacked body S2 may be covered with the resin layer 90. At this time, the stability is improved by sealing the lower surfaces of the stacked body S1 and the stacked body S2 with a resin. When a thickness of the resin layer 90 on the lower surface of the stacked body S1 and the stacked body S2 is made appropriate, both heat dissipation and stability can be achieved.

(b) In the second embodiment, a lower surface of the semiconductor chip 200 may also be covered with the resin layer 90. At this time, the stability is improved by sealing the lower surface of the semiconductor chip 200 with a resin. If the thickness of the resin layer 90 on the lower surface of the semiconductor chip 200 is made appropriate, both heat dissipation and stability can be achieved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a first stacked body including a plurality of first semiconductor chips stacked on top of one another in a first direction and offset relative to each other in a second direction perpendicular to the first direction;
    a first columnar electrode coupled to an electrode pad of the first semiconductor chip and extending in the first direction;
    a second stacked body arranged relative to the first stacked body in the second direction and including a plurality of second semiconductor chips stacked on top of one another in the first direction and offset relative to each other in the second direction;
    a second columnar electrode coupled to an electrode pad of the second semiconductor chip and extending in the first direction; and
    a third semiconductor chip arranged substantially equally spaced to the first columnar electrode and the second columnar electrode.

2. The semiconductor device according to claim 1, wherein
    a first height of the first stacked body and a second height of the second stacked body are substantially equal, and
    the third semiconductor chip extends over the first stacked body and the second stacked body along the second direction, respectively.

3. The semiconductor device according to claim 2, wherein
    respective long sides of the first semiconductor chip and the second semiconductor chip face each other, and
    a long side of the third semiconductor chip is orthogonal to the long side of each of the first semiconductor chip and the second semiconductor chip.

4. The semiconductor device according to claim 1, wherein
    a first height of the first stacked body and a second height of the second stacked body are substantially equal,
    the semiconductor device further includes:
        a third stacked body that extends over the first stacked body and the second stacked body along the second direction, and includes a plurality of fourth semiconductor chips stacked on top of one another in the first direction and offset relative to each other in the second direction; and
        a third columnar electrode coupled to an electrode pad of the fourth semiconductor chip and extending in the first direction, and
    wherein the third semiconductor chip is disposed on the third stacked body.

5. The semiconductor device according to claim 1, wherein
    the third semiconductor chip is arranged between the first stacked body and the second stacked body along the second direction.

6. The semiconductor device according to claim 5, further comprising:
    a connection bump connected to an electrode pad of the third semiconductor chip, wherein
    the third semiconductor chip has a thickness greater than each of the first semiconductor chip and the second semiconductor chip.

7. The semiconductor device according to claim 6, wherein
    the thickness of the third semiconductor chip is substantially equal to a height of a higher one of the first stacked body and the second stacked body.

8. The semiconductor device according to claim 5, wherein
    an upper one of the first semiconductor chips is disposed farther away from the third semiconductor chip along the second direction than a lower one of the first semiconductor chips is, and an upper one of the second semiconductor chips is disposed farther away from the third semiconductor chip along the second direction than a lower one of the second semiconductor chips is, the first columnar electrode is disposed between at least one of the first semiconductor chips and the third semiconductor chip, and the second columnar electrode is disposed between at least one of the second semiconductor chips and the third semiconductor chip.

9. The semiconductor device according to claim 1, wherein the third semiconductor chip is disposed at a substantially central portion of each of the first stacked body and the second stacked body when viewed from the top.

10. The semiconductor device according to claim 1, wherein a number of the first semiconductor chips is substantially the same as a number of the second semiconductor chips.

11. The semiconductor device according to claim 1, further comprising:

a redistribution layer over the first stacked body, the second stacked body, and the third semiconductor chip, wherein the redistribution layer is configured to couple each of first columnar electrode, the second columnar electrode, and the third semiconductor chip to a metal bump.

12. The semiconductor device according to claim 11, wherein the metal bump is disposed along a first side opposite to a second side in contact with the first columnar electrode and the second columnar electrode.

13. A method, comprising:

forming a first stacked body including a plurality of first semiconductor chips stacked on top of one another in a first direction, and offset relative to each other in a second direction perpendicular to the first direction;

forming a second stacked body including a plurality of second semiconductor chips stacked on top of one another in the first direction, and offset relative to each other in the second direction; and forming a third semiconductor chip arranged substantially equally spaced to one of first columnar electrodes coupled to the first stacked body and one of second columnar electrodes coupled to the second stacked body.

14. The method of claim 13, wherein the first columnar electrode has a first height and the second columnar electrode has a second height, the first height being substantially equal to the second height.

15. The method of claim 13, wherein the third semiconductor electrode extends over a portion of the first stacked body and a portion of the second stacked body along the second direction, respectively.

16. The method of claim 13, wherein a number of the first semiconductor chips is substantially the same as a number of the second semiconductor chips.

17. The method of claim 13, further comprising:

forming a redistribution layer over the first stacked body, the second stacked body, and the third semiconductor chip, wherein the redistribution layer is configured to couple each of first columnar electrodes, each of the second columnar electrodes, and the third semiconductor chip to a metal bump.

18. The method of claim 17, wherein the metal bump is disposed along a first side opposite to a second side in contact with the first columnar electrodes and the second columnar electrodes.

* * * * *